(12) United States Patent
Jiang et al.

(10) Patent No.: US 7,719,314 B1
(45) Date of Patent: *May 18, 2010

(54) SLEW RATE CONTROL CIRCUIT FOR SMALL COMPUTER SYSTEM INTERFACE (SCSI) DIFFERENTIAL DRIVER

(75) Inventors: Bin Jiang, Singapore (SG); Sang Kong Chan, Singapore (SG)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/546,237

(22) Filed: Aug. 24, 2009

Related U.S. Application Data (63) Continuation of application No. 11/985,706, filed on Nov. 16, 2007, now Pat. No. 7,579,873, which is a continuation of application No. 11/122,444, filed on May 5, 2005, now Pat. No. 7,298,173.

(60) Provisional application No. 60/622,195, filed on Oct. 26, 2004.

(51) Int. Cl.
*H03K 19/0175* (2006.01)
*H03K 3/00* (2006.01)

(52) U.S. Cl. .............................. 326/83; 326/87; 327/108

(58) Field of Classification Search .............. 326/82–87
See application file for complete search history.

(56) References Cited

U.S. PATENT DOCUMENTS

| | | | |
|---|---|---|---|
| 3,543,009 A | 11/1970 | Voelcker, Jr. | |
| 4,112,253 A | 9/1978 | Wilhelm | |
| 4,131,767 A | 12/1978 | Weinstein | |
| 4,152,541 A | 5/1979 | Yuen | |
| RE30,111 E | 10/1979 | Blood, Jr. | |
| 4,362,909 A | 12/1982 | Snijders et al. | |
| 4,393,494 A | 7/1983 | Belforte et al. | |
| 4,727,566 A | 2/1988 | Dahlqvist | |
| 4,888,762 A | 12/1989 | Arai | |

(Continued)

FOREIGN PATENT DOCUMENTS

DE   10 2004 017 497   11/2004

(Continued)

OTHER PUBLICATIONS

"Power Efficient and Reduced EMI Emissions Transmitter"; U.S. Appl. No. 60/106,265, filed Oct. 30, 1998; Chan.

(Continued)

*Primary Examiner*—James H. Cho
*Assistant Examiner*—Thienvu V Tran (57) ABSTRACT

An interface driver circuit includes a plurality of delay cells. Each delay cell includes a data input, a delayed data output configured to communicate with the data input of an adjacent one of the plurality of delay cells. A delay time input is configured to set a delay value between receiving data at the data input and generating the delayed data output. A plurality of predrivers is configured to receive an output enable signal. A plurality of predrivers is configured to receive a corresponding one of the plurality of delayed data outputs. A plurality of predrivers is configured to generate a predriver output signal based on the output enable signal and the corresponding one of the plurality of delayed data outputs. The output enable signal enables and disables the plurality of predrivers and is independent of data of each delayed data output.

18 Claims, 6 Drawing Sheets

U.S. PATENT DOCUMENTS

| | | | |
|---|---|---|---|
| 4,935,919 A | 6/1990 | Hiraguchi | |
| 4,947,171 A | 8/1990 | Pfeifer et al. | |
| 4,999,830 A | 3/1991 | Agazzi | |
| 5,066,873 A | 11/1991 | Chan et al. | |
| 5,222,084 A | 6/1993 | Takahashi | |
| 5,305,379 A | 4/1994 | Takeuchi | |
| 5,307,405 A | 4/1994 | Sih | |
| 5,323,157 A | 6/1994 | Ledzius et al. | |
| 5,357,145 A | 10/1994 | Segaram | |
| 5,388,092 A | 2/1995 | Koyama et al. | |
| 5,418,478 A | 5/1995 | Van Brunt et al. | |
| 5,465,272 A | 11/1995 | Smith | |
| 5,471,665 A | 11/1995 | Pace et al. | |
| 5,489,873 A | 2/1996 | Kamato et al. | |
| 5,508,656 A | 4/1996 | Jafford et al. | |
| 5,517,141 A | 5/1996 | Abdi et al. | |
| 5,517,435 A | 5/1996 | Sugiyama | |
| 5,539,773 A | 7/1996 | Knee et al. | |
| 5,572,158 A | 11/1996 | Lee et al. | |
| 5,587,681 A | 12/1996 | Fobbester | |
| 5,596,439 A | 1/1997 | Dankberg et al. | |
| 5,625,357 A | 4/1997 | Cabler | |
| 5,648,738 A | 7/1997 | Welland et al. | |
| 5,651,029 A | 7/1997 | Yang et al. | |
| 5,659,609 A | 8/1997 | Koizumi et al. | |
| 5,663,728 A | 9/1997 | Essenwanger | |
| 5,666,354 A | 9/1997 | Cecchi et al. | |
| 5,712,884 A | 1/1998 | Jeong | |
| 5,757,219 A | 5/1998 | Weedon et al. | |
| 5,796,725 A | 8/1998 | Muraoka | |
| 5,798,664 A | 8/1998 | Nagahari et al. | |
| 5,822,426 A | 10/1998 | Rasmus et al. | |
| 5,825,819 A | 10/1998 | Cogburn | |
| 5,844,439 A | 12/1998 | Zortea | |
| 5,864,587 A | 1/1999 | Hunt | |
| 5,880,615 A | 3/1999 | Bazes | |
| 5,936,450 A | 8/1999 | Unger | |
| 5,940,442 A | 8/1999 | Wong et al. | |
| 5,940,498 A | 8/1999 | Bardl | |
| 6,043,766 A | 3/2000 | Hee et al. | |
| 6,044,489 A | 3/2000 | Hee et al. | |
| 6,067,327 A | 5/2000 | Creigh et al. | |
| 6,121,831 A | 9/2000 | Mack | |
| 6,140,857 A | 10/2000 | Bazes | |
| 6,148,025 A | 11/2000 | Shirani et al. | |
| 6,172,634 B1 | 1/2001 | Leonowich et al. | |
| 6,185,263 B1 | 2/2001 | Chan | |
| 6,188,282 B1 | 2/2001 | Montalvo | |
| 6,249,164 B1 | 6/2001 | Cranford, Jr. et al. | |
| 6,259,680 B1 | 7/2001 | Blackwell et al. | |
| 6,259,745 B1 | 7/2001 | Chan | |
| 6,275,098 B1 | 8/2001 | Uehara et al. | |
| 6,288,604 B1 | 9/2001 | Shih et al. | |
| 6,332,004 B1 | 12/2001 | Chan | |
| RE37,619 E | 4/2002 | Mercer et al. | |
| 6,373,908 B2 | 4/2002 | Chan | |
| 6,389,077 B1 | 5/2002 | Chan | |
| 6,411,647 B1 | 6/2002 | Chan | |
| 6,433,608 B1 | 8/2002 | Huang | |
| 6,462,688 B1 | 10/2002 | Sutardja | |
| 6,477,200 B1 | 11/2002 | Agazzi et al. | |
| 6,509,857 B1 | 1/2003 | Nakao | |
| 6,570,931 B1 | 5/2003 | Song | |
| 6,594,304 B2 | 7/2003 | Chan | |
| 6,597,233 B2 | 7/2003 | Ray | |
| 6,687,286 B1 | 2/2004 | Leonowich et al. | |
| 6,690,742 B2 | 2/2004 | Chan | |
| 6,710,617 B2 * | 3/2004 | Humphrey | 326/30 |
| 6,744,831 B2 | 6/2004 | Chan | |
| 6,774,693 B2 | 8/2004 | Carr | |
| 6,882,216 B2 | 4/2005 | Kang | |
| 6,925,130 B2 | 8/2005 | Chan | |
| 6,931,073 B2 | 8/2005 | Chan | |
| 6,954,490 B2 | 10/2005 | Chan | |
| 6,956,708 B1 | 10/2005 | Sutardja et al. | |
| 6,963,616 B2 | 11/2005 | Chan | |
| 7,218,687 B2 | 5/2007 | Huang et al. | |
| 7,298,173 B1 | 11/2007 | Jiang et al. | |
| 7,342,982 B2 | 3/2008 | Lin et al. | |
| 7,388,909 B2 | 6/2008 | Lin et al. | |
| 7,492,840 B2 | 2/2009 | Chan | |
| 2004/0208312 A1 | 10/2004 | Okuda | |
| 2006/0038596 A1 | 2/2006 | Wang | |

FOREIGN PATENT DOCUMENTS

| | | |
|---|---|---|
| EP | 0 800 278 | 8/1997 |
| JP | 58-111415 | 7/1983 |
| JP | 3-273704 | 12/1991 |
| JP | 4-293306 | 10/1992 |
| JP | 4-351109 | 12/1992 |
| JP | 7-131260 | 5/1995 |
| JP | 10-126183 | 5/1998 |
| TW | 0497334 | 8/2002 |
| TW | 0512608 | 12/2002 |
| TW | 0545016 | 8/2003 |
| WO | WO 99/46867 | 9/1999 |
| WO | WO 00/27079 | 5/2000 |
| WO | WO 00/28663 | 5/2000 |
| WO | WO 00/28668 | 5/2000 |
| WO | WO 00/28691 | 5/2000 |
| WO | WO 00/28712 | 5/2000 |
| WO | WO 00/35094 | 6/2000 |

OTHER PUBLICATIONS

Bertolaccini, Mario, et al., A Precision Baseline Offset and Drift Corrector for Low-Frequency Applications, IEEE Transactions on Instrumentation and Measurement, vol. IM-34, No. 3, Sep. 1985, pp. 405-412.

Everitt, James, et al., "A CMOS Transceiver for 10-Mb/s and 100-Mb/s Ethernet," IEEE Journal of Solid State Circuits, vol. 33, No. 12, Dec. 1998, pp. 2169-2177.

Gigabit Ethernet Alliance, "Gigabit Ethernet 1000BASE-T Whitepaper", copyright 1997.

Goldberg, Lee, "Gigabit Ethernet PHY Chip Sets LAN Speed Record for CopperStory," Tech Insights, Nov. 16, 1998.

H4000 Digital Ethernet Transceiver Technical Manual, Distributed Systems, Chapter 3, pp. 3-1 to 3-11, copyright 1982 by Digital Equipment Corporation.

IEEE Standards 802.3ab-2002, "Part 3: Carrier sense multiple access with collision detection (CSMA/CD) access method and physical layer specifications", pp. 147-249.

Kelly, N. Patrick, et al., "WA 18.5—A Mixed-Signal DFE/FFE Receiver for 100Base-TX Applications," ISSCC 2000/Session 18/Wireline Communications/Paper WA 18.5, 2000 IEEE International Solid-State Circuits Conference, pp. 310-311.

Linear Technology, High Speed Modem Solutions, InfoCard 20, Linear Technology Corporation.

Linear Technology, LT1355/LT1356, Dual and Quad 12MHz, 400V/us Op Amps, Linear Technology Corporation, pp. 1-16.

Linear Technology, LT1358/LT 1359, Dual and Quad 25MHz, 600V/us Op Amps, Linear Technology Corporation, pp. 1-12.

Linear Technology, LT1361/LT 1362, Dual and Quad 50MHz, 800V/us Op Amps, Linear Technology Corporation, pp. 1-12.

Linear Technology, LT1364/LT 1365, Dual and Quad 70MHz, 1000V/us Op Amps, Linear Technology Corporation, pp. 1-12.

Linear Technology, LT1813/LT 1814, Dual and Quad 3mA, 100MHz, 750V/us Operational Amplifiers, Linear Technology Corporation, pp. 1-16.

Mueller, K.H., "Combining Echo Cancellation and Decision Feedback Equalization," The Bell System Technical Journal, vol. 58, No. 2, Feb. 1979, pp. 491-500.

Sedra, Adel S and Smith, Kenneth C. "Microelectronic Circuits". Saunders College Publishing, Third Edition, Chapter 2, Section 2.4, 1991, pp. 61-63.

Song, Bang-Sup, et al., "FP 12.1: NRZ Timing Recovery Technique for Band-Limited Channels," ISSCC 96/Session 12/Serial Data Communications/Paper FP 12.1, 1996 IEEE International Solid State Circuits Conference pp. 194-196.

Stonick, John T. et al., "An Adaptive PAM-4 5-Gb/s Backplane Transceiver in .025- um CMOS." IEEE Journal of Solid State Circuits, vol. 38, No. 3, Mar. 2003.

The Electrical Engineering Handbook, Chapter 31, "D/A and A/D Converters," Richard C. Dorf, editor, CRC Press 1993.

Uda, et al., "125Mbit/s Fiber Optic Transmitter/Receiver with Duplex Connector", Fiber Optic Communications Development Div., NEC Corporation, NEC Engineering, Ltd. and English Language Translation.

Yamaguchi, et al., "400Mbit/s Submarine Optical Repeater Using Integrated Circuits," Fujitsu Laboratories, Ltd. and English Language Translation.

* cited by examiner

SLEW RATE CONTROL CIRCUIT FOR SMALL COMPUTER SYSTEM INTERFACE (SCSI) DIFFERENTIAL DRIVER

CROSS-REFERENCE TO RELATED APPLICATIONS

This application is a continuation of U.S. patent application Ser. No. 11/985,706, filed Nov. 16, 2007, which is a continuation of U.S. patent application Ser. No. 11/122,444 (Now U.S. Pat. No. 7,298,173), filed May 5, 2005, which application claims priority of U.S. Provisional Patent Application No. 60/622,195, filed Oct. 26, 2004. The disclosures of the above applications are incorporated herein by reference.

FIELD OF THE INVENTION

The present invention relates to electrical circuits that provide an output port having a programmable slew rate.

BACKGROUND OF THE INVENTION

Figure 1:
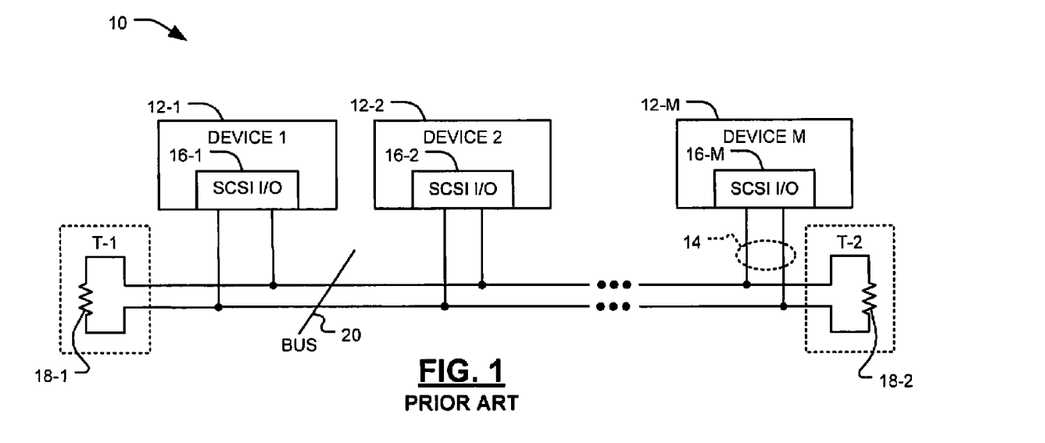
FIG. 1 is a functional block diagram of computing devices connected by a communication cable.

Referring now to FIG. 1, a computer system 10 is shown. A plurality of computing devices 12-1, 12-2, ... 12-M, collectively referred to as computing devices 12, are connected by a communication cable 14. The communication cable 14 connects to differential signal bus interfaces 16-1, 16-2, ..., 16-M, such as small computer system interfaces (SCSI interfaces), associated with respective computing devices 12. The interfaces 16-1, 16-2, ..., 16-M are collectively referred to as the interfaces 16. The computing devices 12 may include a host controller, disk drive and/or any other device having a compatible SCSI interface. Terminators T-1 and T-2 include terminating bias resistors 18-1 and 18-2, referred to collectively as bias resistors 18, which are connected across conductors at opposite ends of the communication cable 14. In some applications, a single terminator T is used at one end of the communication cable 14. In practice, a plurality of cables 14 and terminating bias resistors 18 would connect the interfaces 16 to form a parallel data bus 20. The data bus 20 may have several channels that each carry a bit of data per cycle. The data bus 20 may include additional channels for control signals. For purposes of clarity, only one channel of the parallel data bus 20 is described herein.

Figure 2:
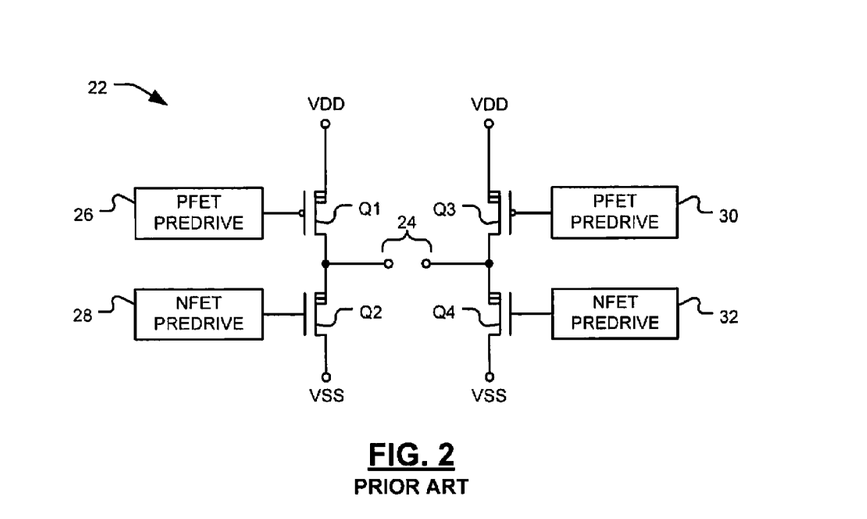
FIG. 2 is a schematic diagram of a driver of the prior art.

Turning now to FIG. 2, an output driver 22 of the prior art is shown. The output driver 22 provides an output port 24 that connects to the communication cable 14 and the bias resistor 18. A p-channel field effect transistor (PFET) Q1 has a gate connected to a PFET predriver 26. A drain of the PFET Q1 is connected to a voltage source VDD. A source of the PFET Q1 is connected to a drain of an n-channel field effect transistor (NFET) Q2. A gate of the NFET Q2 is connected to an NFET predriver 28. A source of the NFET Q2 is connected to a reference voltage VSS. The connection between the source of the PFET Q1 and the drain of the NFET Q2 provides one node of the output port 24. A PFET Q3 has a gate connected to a PFET predriver 30. A drain of the PFET Q3 is connected to the voltage source VDD. A source of the PFET Q3 is connected to a drain of an NFET Q4. A gate of the NFET Q4 is connected to an NFET predriver 32. A source of the NFET Q4 is connected to the reference voltage VSS. The connection between the source of the PFET Q3 and the drain of the NFET Q4 provides the second node of the output port 24. Such an arrangement of the PFETs and NFETs Q1-Q4 may be referred to as an "H-bridge."

When the PFET Q1 and the NFET Q4 are turned on, and the PFET Q3 and the NFET Q2 are turned off, then current flows in a first direction through the output port 24. When the PFET Q1 and the NFET Q4 are turned off, and the PFET Q3 and the NFET Q2 are turned on, then current flows in a second direction through the output port 24. As the current flows through the output port 24 in the first and second directions, high and low voltages are developed across the bias resistor 18. The high and low voltages typically range from +0.5V to −0.5V, and provide a data signal representing digital ones and zeros on the communication cable 14. Drive voltages applied to the gates of the PFETS and NFETS Q1-Q4 by the PFET and NFET predrivers 26, 28, 30, and 32, may be adjusted. The drive voltages determine a slew rate during transitions between the high and low voltages across the bias resistor 18. Such a configuration is described in U.S. Pat. No. 6,597,233, the specification of which is incorporated herein by reference. While the output port 24 of the prior art provides an adjustable slew rate, the actual slew rate obtained may vary undesirably depending on variables such as a length of the communication cable 14 and manufacturing variables of the PFETs and NFETs Q1-Q4.

SUMMARY OF THE INVENTION

A small computer system interface (SCSI) driver circuit having a programmable slew rate comprises N cascaded delay cells each including a data bit input, a delayed data bit output that communicates with the data bit input of an adjacent one of the N cascaded delay cells, and a delay time input that receives a programmable delay time value for setting a variable delay between receiving data at the data bit input and generating the delayed data bit output. N predrivers receive an output enable signal and a corresponding one of the N delayed data bit outputs and generate a predriver output signal based on the output enable and the corresponding one of the N delayed data bit outputs. N drivers have inputs that receive predriver output signals from corresponding ones of the N predrivers. An output port communicates with outputs of the N drivers.

In other features, a delay control module generates the delay times for the N cascaded delay cells. A bit of data input to a first of the N data bit inputs cascades through the N cascaded delay cells. The N drivers sequentially respond to the outputs of the N predrivers to provide the predetermined slew rate at the output port. The delay control module includes a digital-to-analog converter (DAC) that receives a digital delay signal and that generates an analog delay signal and a bias generator that receives the analog delay signal and that biases the N cascaded delay cells.

In still other features, each of the N cascaded delay cells further comprise a charge storage device that is charged by the output voltage and that provides the delay time. The charge storage device includes a capacitor. The N drivers include H-bridges. Each of the N drivers further comprises a current source. Each of the N drivers further comprises a reference current source that provides a reference current for the current sources. A computing device comprises a plurality of the SCSI drivers. Each of the N predrivers includes an enable input, a predriver output, and a mapping circuit that maps a corresponding one of the N delayed data bit outputs and the enable input to a corresponding predriver output signal.

Further areas of applicability of the present invention will become apparent from the detailed description provided hereinafter. It should be understood that the detailed description and specific examples, while indicating the preferred embodiment(s) of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses. For purposes of clarity, the same reference numbers will be used in the drawings to identify similar elements. As used herein, the term module and/or device refers to an Application Specific Integrated Circuit (ASIC), an electronic circuit, a processor (shared, dedicated, or group), and memory that execute one or more software or firmware programs, a combinational logic circuit, and/or other suitable components that provide the described functionality. For purposes of clarity, the same reference numerals will be used to identify similar elements. References to logical 1, true, and on are equivalent to each other, and references to logical 0, false, and off are equivalent to each other, unless otherwise noted. Parts or all of the invention may also be implemented with equivalent embodiments using logic that is inverted from that disclosed.

Figure 3:
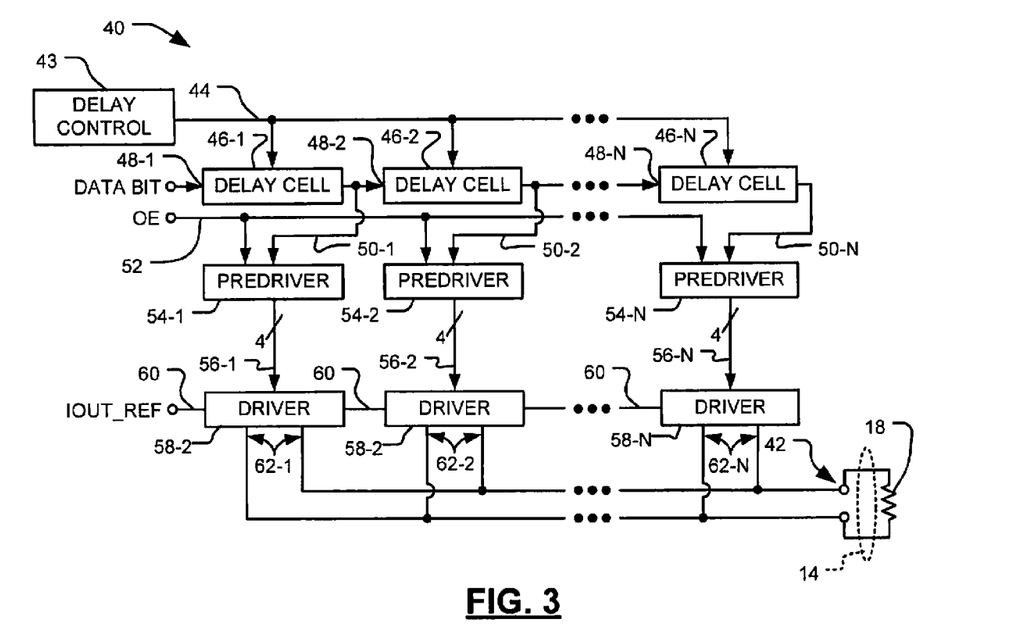
FIG. 3 is a functional block diagram of an output port circuit for connection to a communication bus.

Referring now to FIG. 3, an output port circuit 40 is shown. The output port circuit 40 is connected to the bias resistor 18 by the communication cable 14. An output port 42 provides an output signal having a predetermined slew rate. A delay setting module 43 programmably sets slew rate by applying a delay signal to a delay time input 44. The delay setting module 43 may program all of the delay modules individually to two or more delay values and/or collectively to a common delay value. 1 to N conductors may be used to connect the delay setting module to the delay to the delay cells 46. In some implementations, the delay time input 44 may be a 3-bit wide parallel binary input providing $2^3=8$ unique slew rates. Cascaded delay cells 46-1, 46-2, . . . , 46-N, referred to collectively as the cascaded delay cells 46, each receive the delay signal. Each of the cascaded delay cells 46 has an input 48-1, 48-2, . . . , 48-N, referred to collectively as the data inputs 48, that receive a data bit. Each of the cascaded delay cells 46 also has a delayed data output 50-1, 50-2, . . . , 50-N, referred to collectively as the delayed data outputs 50. Each of the data inputs 48-2 through 48-N is connected to a delayed data output 50-1, 50-2, 50-(N−1) of the preceding cascaded delay cell 46. The data input 48-1 of the first cascaded delay cell 46-1 receives a data bit from an associated computing device 12. Each cascaded delay cell 46 propagates its data bit from its input 48 to its delayed data output 50 after the delay time.

Therefore, the data bit applied to the first input 48-1 propagates to the last delayed data output 50-N after N multiples of the delay time. In a preferred embodiment, N=8 and each cascaded delay cell 46 provides a delay time between about 125 picoseconds and 375 picoseconds. The preferred embodiment thereby provides a slew rate adjustable between about 1 nanosecond and 3 nanoseconds, although other delay ranges can be used.

An output enable line 52 is active high and connected to a plurality of predrivers 54-1, 54-2, . . . , 54-N, referred to collectively as the predrivers 54. Each of the predrivers 54 has a data input connected to the delayed data output 50 of a respective one of the cascaded delay cells 46. Each of the predrivers 54 implements a truth table, described later herein. The truth table uses the output enable line 52 and the delayed data output 50 to generate four output signals. The four output signals are communicated over output lines 56-1, 56-2, . . . , 56-N, referred to collectively as output lines 56, of each respective predriver 54.

The output lines 56 of each predriver 54 are connected to a respective driver 58-1, 58-2, . . . , 58-N, referred to collectively as the drivers 58. Each of the drivers 58 has an input for a reference current signal 60 and a driver output port 62. The driver output ports 62 are connected in parallel to form the output port 42. When the output enable line 52 is high, a data bit propagates through the cascaded delay cells 46 and causes the driver output ports 62 to turn on or off in succession. As each output port 62 turns on or off, a magnitude of a signal appearing at the output port 42 increases or decreases, respectively, thereby providing a predetermined slew rate.

Figure 4:
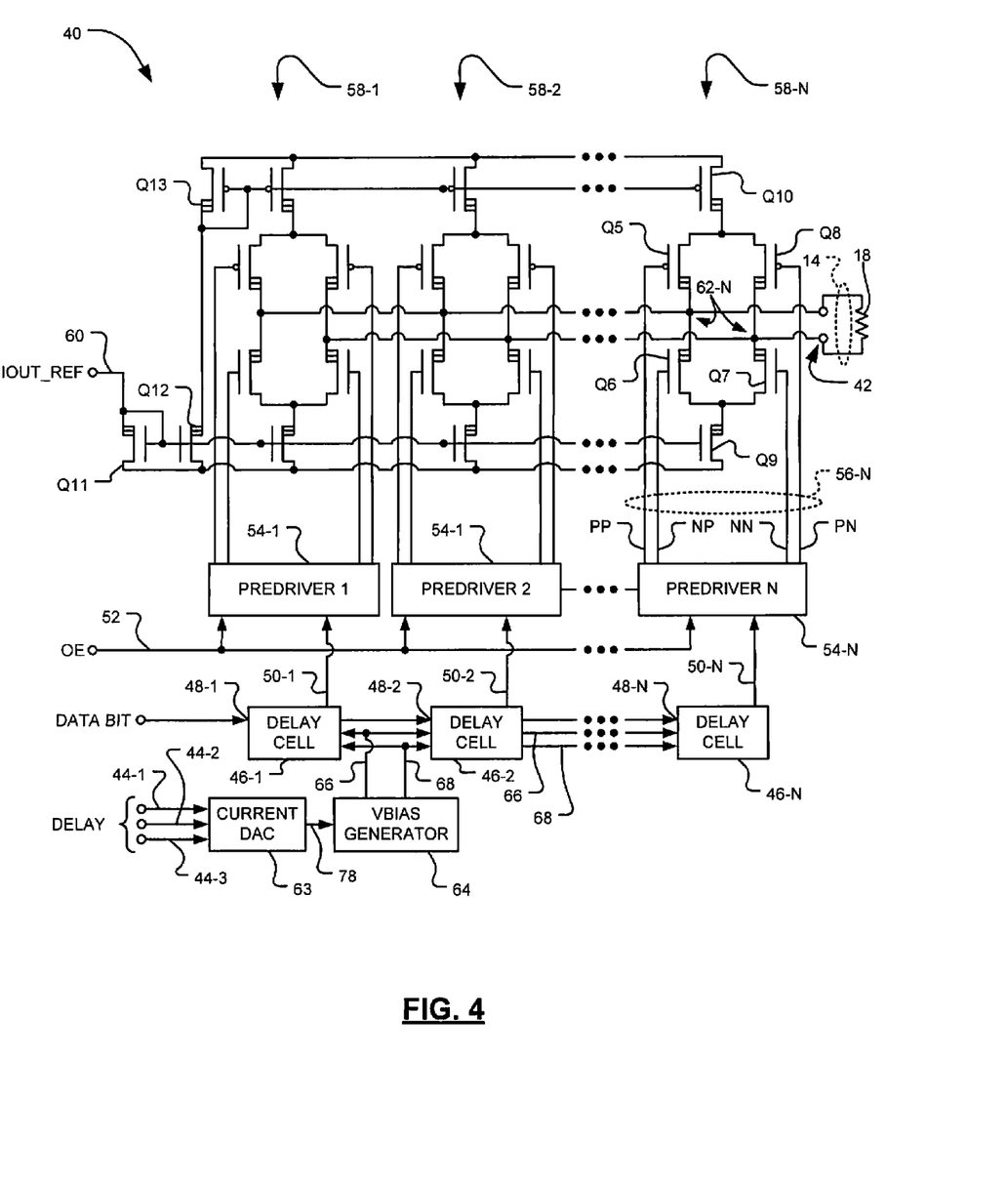
FIG. 4 is a schematic diagram of driver stages of an output port circuit.

Turning now to FIG. 4, a partial schematic diagram is shown of the output port circuit 40. The three lines of delay time input 44 are shown individually as 44-1, 44-2, and 44-3. The delay time input 44 is connected to a digital-to-analog converter (current DAC) 63. A current output of the DAC 63 is applied to a bias voltage generator 64. The DAC 63 receives the delay signal and converts it to a current as is described later. The bias voltage generator 64 converts the current to a positive bias voltage 66 and a negative bias voltage 68. The positive and negative bias voltages 66, 68 are applied to each of the cascaded delay cells 46. The cascaded delay cells 46 use the positive and negative bias voltages 66, 68 to operate internal circuitry as described later.

Circuitry of the drivers 58 will now be described. For the purpose of clarity, only the driver 58-N will be described. The four output signals 56 from the predriver 54 are connected to an H-bridge. An output signal PP is connected to a gate of a PFET Q5. An output signal NP is connected to a gate of an NFET Q6. An output signal NN is connected to a gate of an NFET Q7. An output signal PN is connected to a gate of a PFET Q8. A source of the NFET Q6 is connected to a source of the NFET Q7. A source of the PFET Q5 is connected to a source of PFET Q8. A drain of the NFET Q6 is connected to a drain of the PFET Q5 and provides a negative node of the driver output port 62. A drain of the NFET Q7 is connected to a drain of the PFET Q8 and provides a positive node of the driver output port 62. An NFET Q9 is configured as a current mirror and has a drain connected to the sources of the NFETs Q6 and Q7. A PFET Q10 is configured as a current mirror and has a drain connected to the sources of the PFETs Q5 and Q8.

A current source is formed from NFETs Q11, Q12, and a PFET Q13. A gate and a drain of the NFET Q11 are connected to the reference current source 60 and a gate of the NFET Q12. A source of the NFET Q11 is connected to a source of the NFET Q12. A drain of the NFET Q12 is connected to a drain and a gate of the PFET Q13. The sources of the NFETs Q11 and Q12 are connected to a source of each NFET Q9 in the drivers 58. A source of the PFET Q13 is connected to a source of each PFET Q10 in the drivers 58. The NFET Q12 and the PFET Q13 mirror the reference current signal 60 flowing through the NFET Q11 and provide current to the drivers 58. The NFET Q9 and PFET Q10 assure that the driver circuit output has a predetermined source impedance substantially free from influences resulting from process variations in manufacturing the NFETs and PFETs.

Figure 5:
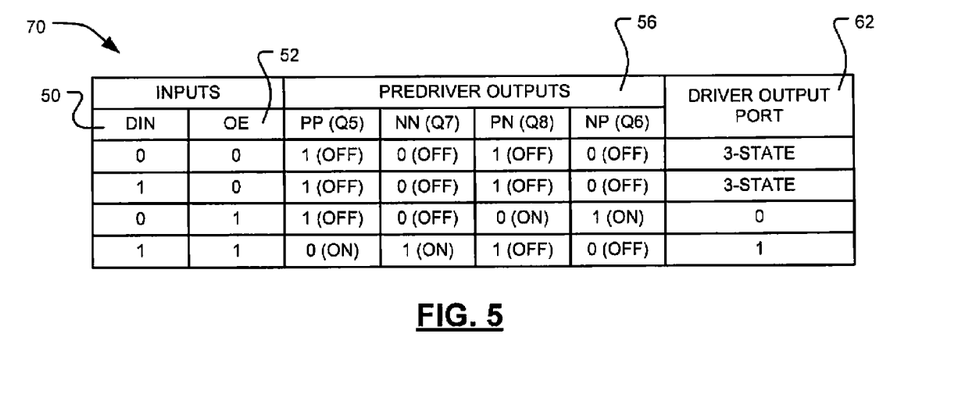
FIG. 5 is a truth table of a predriver stage.

Turning now to FIG. 5, a truth table 70 is shown. The truth table 70 has a first input column for the delayed data bit appearing at the delayed data output 50. A second input column has a state of the output enable (OE) line 52. Four predriver output columns are provided, one for each of the predriver output signals PP, NN, PN, and NP. Entries in the four columns parenthetically indicate whether the associated PFET or NFET Q5-Q8 is turned on or turned off. A rightmost output column indicates a logic state appearing at the driver output port 62. The OE line 52 is a active high signal. When the OE line 52 is low, or zero, the PFETs and NFETs Q5-Q8 are turned off and the driver output port 62 is electrically open (3-state). When the OE line 52 is high and the delayed data bit is low, or logical 0, the PFET Q5 and the NFET Q7 are turned off, and the PFET Q8 and the NFET Q6 are turned on. This combination results in a logical 0 appearing at the driver output port 62. When the OE signal is high and the delayed data bit is high, or logical 1, the PFET Q5 and the NFET Q7 are turned on, and the PFET Q8 and the NFET Q6 are turned off. This combination results in a logical 1 appearing at the driver output port 62. Conventional combinatorial logic may be used to implement the truth table 70 in each of the predrivers 54.

Figure 6:
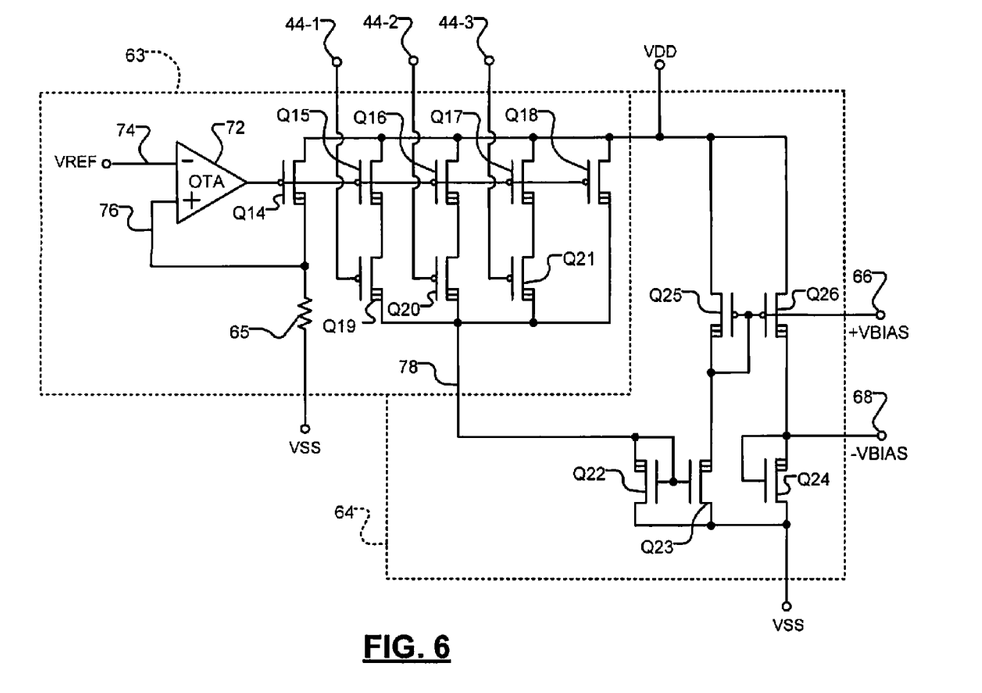
FIG. 6 is a schematic diagram of a bias-voltage generator of a delay stage.

Turning now to FIG. 6, a schematic diagram is shown of the current DAC 63 and the bias voltage generator 64. The current DAC 63 has an operational transconductance amplifier (OTA) with an output connected to gates of PFETs Q14, Q15, Q16, Q17, and Q18. An inverting input 74 of the OTA is connected to a constant voltage source VREF. A non-inverting input 76 of the OTA 72 is connected to a drain of the PFET Q14 and to one end of a resistor 65. The other end of the resistor 65 is connected to the reference voltage VSS. The output of the OTA 72 provides a current proportional to a voltage difference across the non-inverting 74 and inverting 76 inputs. A drain of the PFET Q15 is connected to the supply voltage VDD and to the drains of the PFETs Q15, Q16, and Q18. The three lines of the delay time input 44 are connected to gates of PFETs Q19, Q20, and Q21, respectively. A source of the PFET Q19 is connected to a drain of the PFET Q15. A source of the PFET Q20 is connected to a drain of the PFET Q16. A source of the PFET Q21 is connected to a drain of the PFET Q17. Drains of the PFETs Q18-Q21 are connected together and provide a programmable current output 78.

Operation of the current DAC 63 will now be described. The PFET Q14 mirrors a current provided by the output of the OTA 72. A magnitude of the current is established by adjusting a resistance of the resistor 65. When the PFET Q19 is turned on by the first delay time input line 44-1, the PFET Q15 mirrors the current flowing through the PFET Q14. When the PFET Q20 is turned on by the second delay time input line 44-2, the PFET Q16 mirrors the current flowing through the PFET Q14. When the PFET Q21 is turned on by the third delay time input line 44-3, the PFET Q17 mirrors the current flowing through the PFET Q14. As the number of PFETs Q19-Q21 being turned on by the delay time input lines 44 increases, an increasing current flow is established through the programmable current output 78. The sizes of PFETs Q15-Q18 can be unequal to provide up to eight discrete levels of current flow through the programmable current output 78 in accordance with delay time input lines 44 turning on/off the PFETs Q19, Q20, and Q21.

In the bias voltage generator 64, the current flow from the programmable current output 78 is applied to a drain and a gate of an NFET Q22. A source of the NFET Q22 is connected to the reference voltage VSS, a source of an NFET Q23, and a source of an NFET Q24. A drain of the NFET Q23 is connected to a drain and a gate of a PFET Q25. A source of the PFET Q25 is connected to the voltage source VDD. A drain and a gate of the NFET Q24 are connected to a drain of a PFET Q26. A gate of the PFET Q26 is connected to the gate and the drain of the PFET Q25. A source of the PFET Q26 is connected to the supply voltage VDD. The drain of the PFET Q25 provides the positive bias voltage 66, and the drain of the NFET Q24 provides the negative bias voltage 68.

Operation of the bias voltage generator 64 will now be described. The current flow from the programmable current output 78 is mirrored by the NFET Q22. The NFET Q23 mirrors the current flowing through the NFET Q22. The PFET Q25 drops a voltage across its source and drain as it mirrors the current flowing through the NFET Q23. The drain of the PFET Q25 thereby provides the positive voltage 66 with VDD less the voltage dropped across PFET Q25. The PFET Q26 mirrors the current flowing through the PFET Q25. The NFET Q24 drops a voltage across its source and drain as it mirrors the current flowing through the PFET Q26. The drain of the NFET Q24 thereby provides the negative voltage 68 with a voltage equal to its source-drain voltage drop. The positive and negative 68 bias voltages are applied to the delay cells 46.

Figure 7:
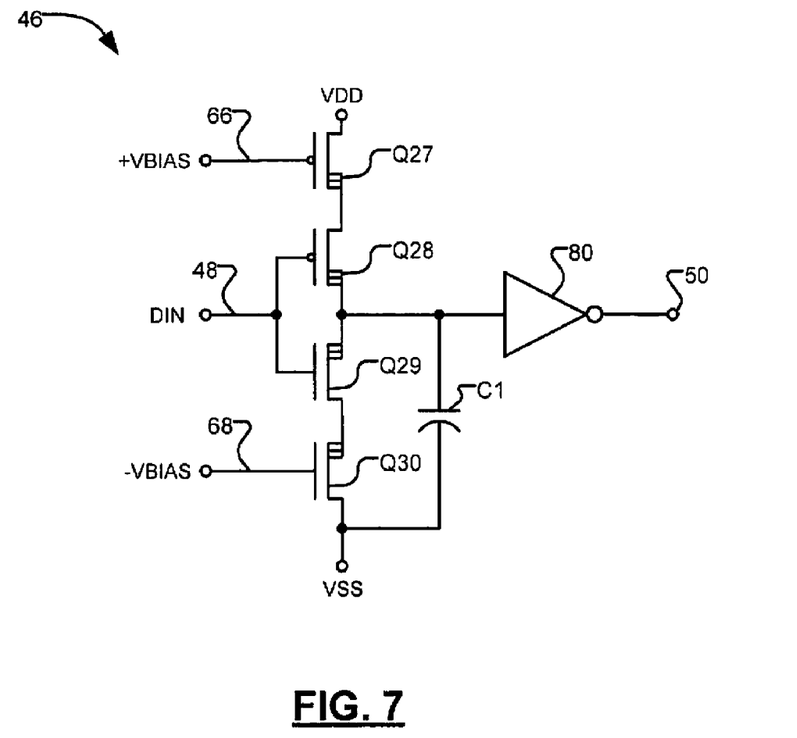
FIG. 7 is a schematic diagram of a delay cell of a delay stage.

Turning now to FIG. 7, a schematic diagram of a delay cell 46 is shown. A source of a PFET Q27 is connected to the supply voltage VDD. A gate of the PFET Q27 is connected to the positive bias voltage 66. A drain of the PFET Q27 is connected to a source of a PFET Q28. A gate of the PFET Q28 is connected to the data bit input 48 of the delay cell 46. A drain of the PFET Q28 is connected to a drain of an NFET Q29, to one end of a capacitor C1, and to an input of an inverter 80. The other end of the capacitor C1 is connected to the reference voltage VSS. A source of the NFET Q29 is connected to a drain of an NFET Q30. A gate of the NFET Q29 is connected to the data bit input 48 of the delay cell 46. A source of the NFET Q30 is connected to the reference voltage VSS. A gate of the NFET Q30 is connected to the negative bias voltage 68. An output of the inverter 80 provides the delayed data output 50.

Operation of the delay cell 46 will now be described. A magnitude of the positive 66 and negative 68 bias voltages establishes drain-source resistances of the PFET Q27 and the NFET Q30. If a logical 1 is applied to the data bit input 48, the PFET Q28 turns off and the NFET Q29 turns on, thereby allowing the capacitor C1 to discharge through the NFETs Q29 and Q30. A rate of discharge is determined by the magnitude of the negative bias voltage 68. With the capacitor C1 discharged, a logical 0 appears at the input of the inverter 80 and a logical 1 appears at the output of the inverter 80. The rate of discharge determines the delay time for the delay cell 46. Alternatively, if a logical 0 is applied to the data bit input 48, the NFET Q29 turns off and the PFET Q28 turns on, thereby allowing the capacitor C1 to charge through the PFETs Q27 and Q28. A rate of charge is determined by the magnitude of the positive bias voltage 66. When capacitor C1 is charged, a logical 1 appears at the input of the inverter 80 and a logical 0 appears at the output of the inverter 80. The rate of charge is preferably equal to the rate of discharge.

Figure 8:
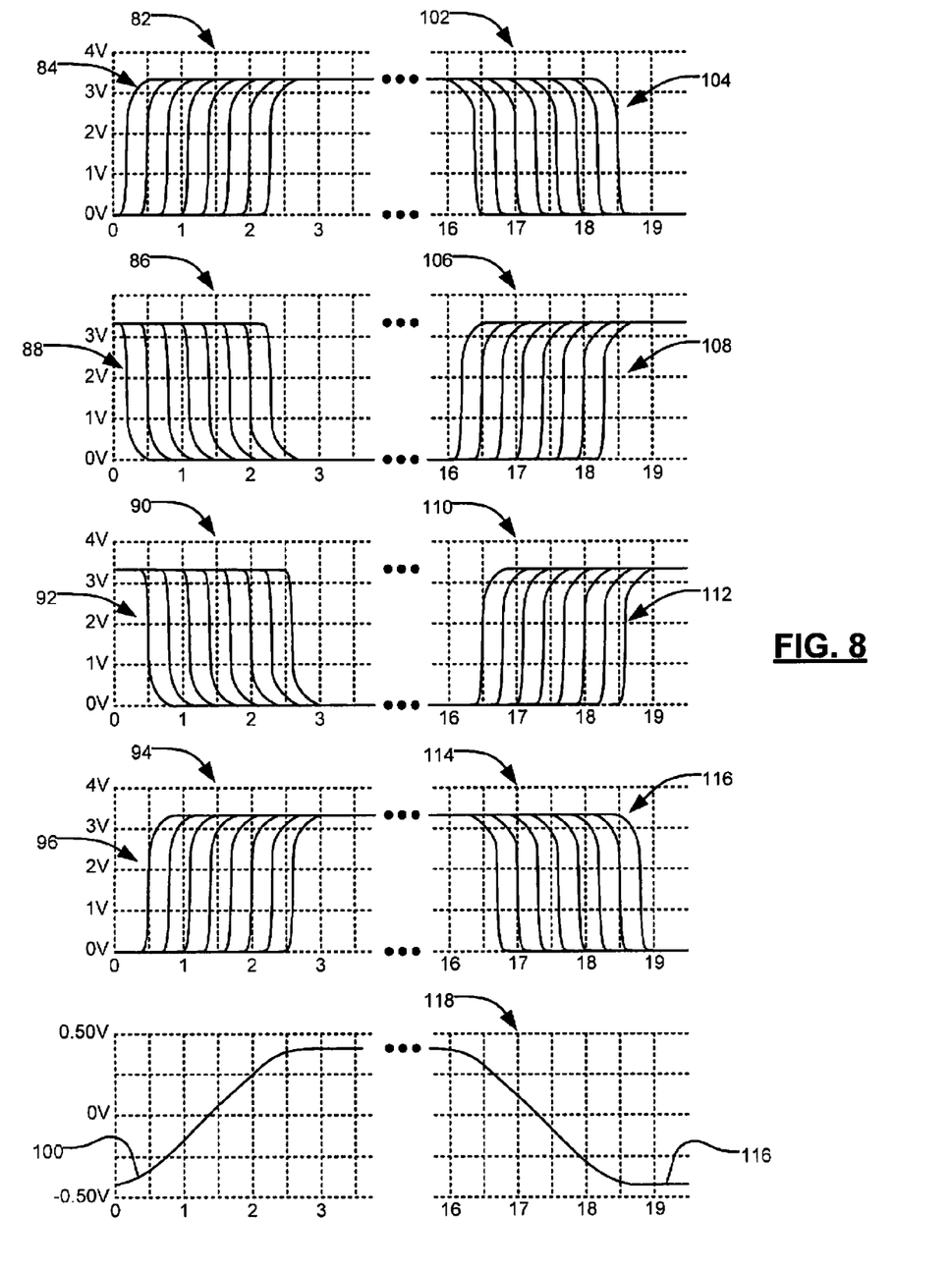
FIG. 8 illustrates signal diagrams of an output driver circuit.

Turning now to FIG. 8, waveforms are shown for an example output port circuit 40 having N=8 cascaded delay cells 46, predrivers 54, and drivers 58. A horizontal axis of each plot indicates time in nanoseconds and a vertical axis of each plot represents volts. The column of plots at a left side of FIG. 8 shows waveforms for a rising edge at the output port 42 caused by a logical 1 being applied to the data input 48-1 while the OE input 52 is high.

A plot 82 shows a set of time correlated curves 84 representing the output signals NN from the predrivers 54. Each output signal NN begins rising after its associated cascaded delay cell 46 propagates the logical 1 data bit.

A plot 86 shows a set of time correlated curves 88 representing the output signals PP from the predrivers 54. Each output signal PP begins falling after its associated cascaded delay cell 46 propagates the logical 1 data bit.

A plot 90 shows a set of time correlated curves 92 representing the output signals NP from the predrivers 54. Each output signal NP begins falling after its associated cascaded delay cell 46 propagates the logical 1 data bit.

A plot 94 shows a set of time correlated curves 96 representing the output signals PN from the predrivers 54. Each output signal PN begins rising after its associated cascaded delay cell 46 propagates the logical 1 data bit.

A plot 98 shows a signal voltage 100 rising at a controlled slew rate in unison with each driver output port 62 applying the logical 1 date bit to the output port 42. The signal voltage 100 rises as the drivers 58 activate in succession according to the output signals NN, PP, NP, and PN.

The column of plots at a right side of FIG. 8 shows waveforms for a falling edge at the output port 42 caused by a logical 0 being applied to the data input 48-1 while the OE input 52 is high.

A plot 102 shows a set of time correlated curves 104 representing the output signals NN from the predrivers 54. Each output signal NN begins falling after its associated cascaded delay cell 46 propagates the logical 0 data bit.

A plot 106 shows a set of time correlated curves 108 representing the output signals PP from the predrivers 54. Each output signal PP begins rising after its associated cascaded delay cell 46 propagates the logical 0 data bit.

A plot 110 shows a set of time correlated curves 112 representing the output signals NP from the predrivers 54. Each output signal NP begins rising after its associated cascaded delay cell 46 propagates the logical 0 data bit.

A plot 114 shows a set of time correlated curves 116 representing the output signals PN from the predrivers 54. Each output signal PN begins falling after its associated cascaded delay cell 46 propagates the logical 0 data bit.

A plot 118 shows a signal voltage 120 falling at a controlled slew rate in unison with each driver output port 62 applying the logical 0 data bit to the output port 42. The signal voltage 120 falls as the drivers 58 activate in succession according to the output signals NN, PP, NP, and PN.

A time between each successive rising edge and/or each successive falling edge in the families of curves is equal to the delay time of the cascaded delay cells 46.

Figure 9:
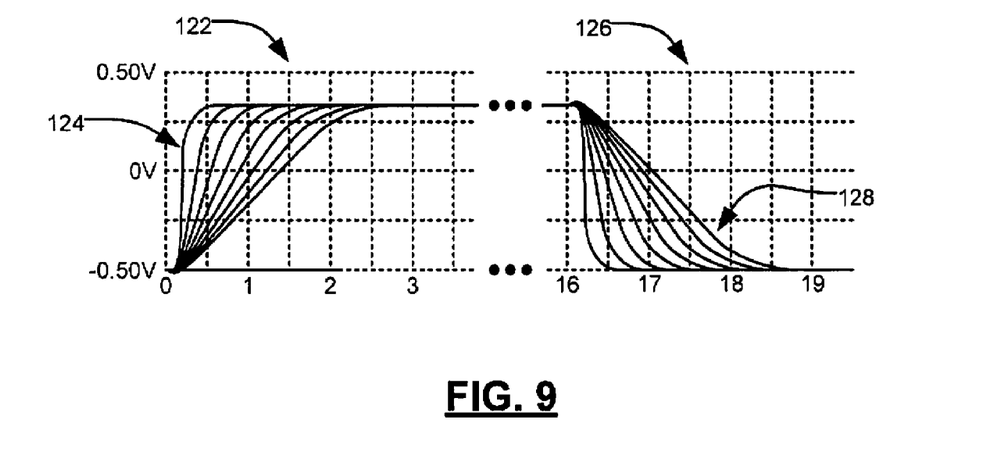
FIG. 9 illustrates a family of output signals of an output port.

Turning now to FIG. 9, families of waveforms are shown for the example output port circuit 40 having N=8 cascaded delay cells 46, predrivers 54, and drivers 58. Each of the cascaded delay cells 46 provide the delay time in accordance with the delay time signal 44. A horizontal axis of each plot indicates time in nanoseconds and a vertical axis of each plot represents volts. A plot 122 shows a family of eight rising edge waveforms 124. Each rising edge waveform is generated at the output port 42 with the cascaded delay cells 46 using a different one of eight discrete delay times. It can be seen from the family of rising edge waveforms 124 that increasing the delay time decreases the slew rate of the output port 42.

A plot 126 shows a family of eight falling edge waveforms 128. Each falling edge waveform is generated at the output port 42 with the cascaded delay cells using a different one of the eight discrete delay times. It can be seen from the family of rising edge waveforms 124 that decreasing the delay time increases the slew rate of the output port.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An interface driver circuit comprising:
a plurality of delay cells, each delay cell including:
a data input,
a delayed data output configured to communicate with the data input of an adjacent one of the plurality of delay cells, and
a delay time input configured to set a delay value between receiving data at the data input and generating the delayed data output; and
a plurality of predrivers configured to
receive an output enable signal;
receive a corresponding one of the plurality of delayed data outputs; and
generate a predriver output signal based on the output enable signal and the corresponding one of the plurality of delayed data outputs,
wherein the output enable signal enables and disables the plurality of predrivers and is independent of data of each delayed data output.

2. The interface driver circuit of claim 1, further comprising:
a plurality of drivers with inputs configured to receive the predriver output signal from a corresponding one of the plurality of predrivers; and
an output port configured to communicate with outputs of the plurality of drivers.

3. The interface driver circuit of claim 1, further comprising a delay control module configured to generate the delay values for the plurality of delay cells.

4. The interface driver circuit of claim 1, wherein the data received by a first one of the plurality of data inputs cascades through the plurality of delay cells.

5. The interface driver circuit of claim 2, wherein the plurality of drivers are configured to sequentially respond to outputs of the plurality of predrivers to provide a predetermined slew rate at the output port.

6. The interface driver circuit of claim 1, wherein the delay control module includes:
a digital-to-analog converter (DAC) configured to
receive a digital delay signal; and to
generate an analog delay signal; and
a bias generator configured to
receive the analog delay signal; and
bias the plurality of delay cells.

7. The interface driver circuit of claim 1, wherein each of the plurality of delay cells further comprises a charge storage device configured to provide one of the delay values.

8. The interface driver circuit of claim 7, wherein the charge storage device includes a capacitor.

9. The interface driver circuit of claim 2, wherein the plurality of drivers each include an H-bridge.

10. The interface driver circuit of claim 2, wherein each of the plurality of drivers further comprises:
   a current source; and
   a reference current source configured to provide a reference current for the current source.

11. The interface driver circuit of claim 1, wherein each of the plurality of predrivers includes:
   an enable input;
   a predriver output; and
   a mapping circuit configured to map a corresponding one of the plurality of delayed data outputs and the enable input to a corresponding one of the predriver output signals.

12. A method for operating an interface driver circuit, the method comprising:
   providing a plurality of delay cells, each delay cell including a data input, a delayed data output, and a delay time input;
   connecting each delayed data output to the data input of an adjacent one of the plurality of delay cells;
   setting a delay value between receiving data at the data input and generating the delayed data output; and
   generating predriver output signals from a plurality of predrivers based on an output enable signal and a corresponding one of the plurality of delayed data outputs,
   wherein the output enable signal enables and disables the plurality of predrivers and is independent of each delayed data output.

13. The method of claim 12, further comprising:
   coupling inputs of a plurality of drivers to the predriver output signal from a corresponding one of the plurality of predrivers; and
   coupling an output port with outputs of the plurality of drivers.

14. The method of claim 12, further comprising generating the delay values for the plurality of delay cells.

15. The method of claim 12, further comprising cascading the data received by a first one of the plurality of data inputs through the plurality of delay cells.

16. The method of claim 13, further comprising sequentially responding to the outputs of the plurality of predrivers to provide a predetermined slew rate at the output port.

17. The method of claim 12, further comprising:
   receiving a digital delay signal;
   generating an analog delay signal; and
   receiving the analog delay signal and biasing the plurality of delay cells based thereon.

18. The method of claim 12, further comprising mapping a corresponding one of the plurality of delayed data outputs and the enable input to a corresponding one of the predriver output signals.

* * * * *